United States Patent
Komatsu

(10) Patent No.: US 6,198,648 B1
(45) Date of Patent: Mar. 6, 2001

(54) SEMICONDUCTOR MEMORY DEVICE WITH HIERARCHICAL BIT LINE ARCHITECTURE

(75) Inventor: Koji Komatsu, Nara (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/451,190

(22) Filed: Nov. 29, 1999

(30) Foreign Application Priority Data

Dec. 1, 1998 (JP) .................................................. 10-342236

(51) Int. Cl.$^7$ ...................................................... G11C 5/02
(52) U.S. Cl. ........................................ 365/51; 365/230.03
(58) Field of Search .......................... 365/230.03, 230.06, 365/51

(56) References Cited

U.S. PATENT DOCUMENTS 5,798,976 * 8/1998 Arimoto .......................... 365/230.03

FOREIGN PATENT DOCUMENTS 6-104406   4/1994 (JP).

* cited by examiner

Primary Examiner—David Nelms
Assistant Examiner—M. Tran
(74) Attorney, Agent, or Firm—Morrison & Foerster LLP

(57) ABSTRACT

A semiconductor memory device includes a semiconductor substrate, a plurality of word lines, a plurality of decoders for selectively activating the plurality of word lines in accordance with an address, and a plurality of banks arranged in a predetermined direction. Each of the plurality of banks is connected to at least one of the plurality of word lines. At least two of the plurality of word lines are connected to one common decoder of the plurality of decoders. Each of at least two of the banks is connected to the at least two word lines of the plurality of word lines. The at least two banks are not adjacent.

8 Claims, 10 Drawing Sheets

SEMICONDUCTOR MEMORY DEVICE WITH HIERARCHICAL BIT LINE ARCHITECTURE

BACKGROUND OF THE INVENTION

1. Field of the Invention

The present invention relates to a semiconductor memory device, and more particularly to a configuration of a memory cell array and a row decoder in a ROM having a hierarchical bit line architecture.

2. Description of the Related Art

A hierarchical bit line architecture has been proposed for conventional nonvolatile memories, e.g., a FLASH-EEPROM and a mask ROM, (see Japanese Laid-Open Publication No. 6-104406).

FIG. 3A illustrates part of a layout pattern of a conventional semiconductor memory device having a hierarchical bit line architecture. FIG. 3B illustrates part of an equivalent circuit of the conventional semiconductor memory device having a hierarchical bit line architecture shown in FIG. 3A. The semiconductor memory device having a hierarchical bit line architecture is provided on a semiconductor substrate. The semiconductor memory device includes a plurality of main bit lines MB1–MB4, . . . ; a plurality of sub bit lines SB11, . . . , SB28, . . . ; a plurality of word lines WL001, . . . , WL232, . . . ; a plurality of memory cell transistors M1–M7, . . . (hereinafter referred to as "memory cells"); a plurality of contacts CT11, . . . , CT22, . . . ; a plurality of auxiliary conductive regions BB11, . . . , BB22, . . . ; a plurality of bank select transistors TB01, . . . , TB27, . . . (hereinafter referred to as "bank cells"); and a plurality of bank select lines BS01, . . . , BS24, . . .

The sub bit lines SB are formed from a diffusion layer of a conductivity type opposite to that of the semiconductor substrate. The word lines WL are provided across the sub bit lines SB and made from polysilicon. Each memory cell M is provided between a pair of adjacent sub bit lines SB. A word line WL is connected to gate electrodes of the memory cells M. Each auxiliary conductive region BB is provided at an end of the sub bit line SB and has the same conductivity type as that of the sub bit line SB. Each bank cell TB is provided between an auxiliary conductive region BB and a sub bit line SB. Each bank select line BS is connected to a gate electrode of a bank cell TB and is made from polysilicon.

The auxiliary conductive regions BB are connected via contacts CT to a main bit line MB. The main bit lines MB are made from a metal. The semiconductor memory device is divided into a plurality of banks BNK0–BNK2, . . . In each bank BNK, an array of the sub bit lines SB are arranged parallel to each other and a set of the auxiliary conductive regions BB are connected to the sub bit lines SB. A number of the bank select lines BS are provided to a bank BNK. A plurality of the banks BNK are provided along the column direction to form a memory cell array. Adjacent banks BNK share a set of the auxiliary conductive regions BB.

In a bank BNK, the sub bit lines SB are arranged in columns. Of adjacent sub bit lines SB, one sub bit line SB is connected via a bank cell TB to a first main bit line MB at one end of the sub bit line SB while the other sub bit line SB is connected via another bank cell TB to a second main bit line MB at the other end of the other sub bit line SB.

The operation of the semiconductor memory device will be described below. In the following description, it is assumed that the semiconductor substrate is of a P-negative type while the sub bit lines SB and the auxiliary conductive regions BB are of an N-positive type.

A memory cell M is selected by setting potentials of the bank select lines BS and the word lines WL to a high level.

The threshold voltage of the memory cell M can be set by the amount of boron ions which are implanted into a channel region of the memory cell M which is formed under a gate electrode thereof. The threshold voltage of the memory cell M becomes greater through ion implantation. A given amount of implanted ions would produce such a memory cell M that remains in an OFF-state even when a gate potential of the memory cell M is at a high level (OFF-cell). The memory cell M without ion implantation can transition to an ON-state when the gate potential is at a high level (ON-cell).

In a similar way, a portion of the bank select line BS which does not form a bank cell TB is subjected to boron ion implantation so as to be permanently in the OFF-state.

A memory cell M in a bank BNK is selected by a row select circuit 202 driving a word line WL that is connected to a gate electrode of the memory cell M to a high level while driving the associated bank select lines BS that are connected to gate electrodes of the associated bank cells TB connected to the sub bit lines SB which are source and drain regions of the memory cell M to a high level. For instance, the memory cell M2 shown shaded in FIGS. 3A and 3B is read out by selecting the bank cells TB11 and TB16. The bank cells TB11 and TB16 are selected by driving the word line WL132 and the bank select lines BS11 and BS14 to a high level and leaving other bit select lines at a low level. When the bank cell TB11 is selected by the high-level bank select line BS11, the sub bit line SB12 becomes electrically connected via the contact CT11 to the main bit line MB2. When the bank cell TB16 is selected by the high-level bank select line BS14, the sub bit line SB13 becomes electrically connected via the contact CT21 to the main bit line MB1.

As described above, the memory cell M2 is selected by activating the word line WL132 and the bank select lines BS11 and BS14 provided on the bank BNK1 including the memory cell M2.

Each of the main bit lines MB are selectively connected to data lines (not shown) by a column select circuit 201. The data content of the selected memory cell M is read out through a route provided by the connection of the data line and main bit line MB.

The two main bit lines MB1 and MB2 are connected via the column select circuit 201 to the data lines. One of the data lines is connected to a low potential while the other of the data lines is connected to a high potential. A state of the memory cell M2 is read out as binary information by detecting a difference in current between the data lines. When the memory cell M2 is an OFF-cell, the other data line remains at the high potential. On the other hand, when the memory cell M2 is an ON-cell, the other data line makes a transition from a high to a low potential. The presence of a transition determines the binary information of the memory cell M2.

By introducing a hierarchical bit line architecture to the memory, the following effect is obtained. Of the plurality of the sub bit lines SB connected to one main bit line MB, only the sub bit lines SB connected to one memory cell M which is a target to be accessed are selected by the bank select lines BS. As a result, a load of the main bit line MB is reduced, thereby realizing high-speed access.

In the above-described nonvolatile memory, a single memory cell M includes one transistor, so that a density of memory cells M is high compared with that of a volatile memory such as a DRAM. However, the wiring pitch of the word lines WL is very small and therefore it is difficult to provide a row decoder and a driving circuit for each word line WL. To solve this problem, a plurality of banks BNK share a group of row decoders and driving circuits. In other words, consecutive plural banks BNK are connected to the same group of row decoders and driving circuits via a common group of word lines WL. Accordingly, the word lines WL each corresponding to an identical row in each of the consecutive plural banks BNK are provided with the same signal and activated simultaneously. To read out an intended memory cell M, it is necessary to activate the bank select lines BS in the bank BNK including the intended memory cell M of the plural banks BNK so as to connect the main bit lines MB to the intended memory cell.

FIG. 3C illustrates a configuration of a conventional semiconductor memory device. Memory cell arrays 11 and 12 are provided on opposite sides of the row select circuit 202. The row select circuit 202 includes a row decoder 30 with a driver 21 and a driver 22 disposed on the right and left sides thereof, respectively. The driver 21 is a circuit for driving a memory cell 11 at the right side thereof while the driver 22 is a circuit for driving a memory cell 12 at the left side thereof.

The row decoder 30 generates a signal to be sent through the bank select line or word line in accordance with an input address signal. The row decoder 30 includes decoders RB1AU, RB1AL, ... which create states of bank select lines BS1AU, BS1AL, ... in accordance with the address signals; and decoders RW101, RW103, ... which create states of word lines WL1A01, WL1A02, ... in accordance with the address signals.

The memory cell array 11 includes banks BNK1A–BNK4B, ... arrayed along a column direction. A group of the word lines WL which are connected to a bank BNK is called a word line group. In FIG. 3C, the word lines WL1A01, ..., WL1B02, ... of the banks BNK1A and BNK2A belong to the same word line group since their word line groups are connected to the same set of decoders RW101–RW104. Therefore, the same signal is supplied to the word lines WL1A01 and WL1BO1. When the word lines WL1A01 and WL1B01 are activated, either a pair of the bank select lines BS1AU and BS1AL or a pair of the bank select lines BS1BU and BS1BL will be activated to select either the bank BNK1A or the bank BNK1B. When the bank select lines BS1AU and BS1AL are activated, the word line WL1A01 can select a memory cell M in the bank BNK1A and then the memory cell M in the bank BNK1A is read out. When the bank select lines BS1BU and BS1BL are activated, the word line WL1B01 can select a memory cell M in the bank BNK1B and then the memory cell M in the bank BNK1B is read out.

Furthermore, it is considered to attempt to widen a wiring pitch of the main bit lines MB in the conventional semiconductor memory device having a hierarchical bit line architecture. To this end, the number of the main bit lines MB is decreased while the number of the sub bit lines SB connected to one main bit line MB may be increased. This leads to a problem that the number of the bank select lines BS increases and therefore a chip size becomes greater.

FIG. 3D illustrates part of another layout pattern of a conventional semiconductor memory device. FIG. 3E illustrates part of an equivalent circuit of the conventional semiconductor memory device shown in FIG. 3D. The same components as those in FIGS. 3A and 3B are indicated by the same reference numerals as those used therein. In FIGS. 3D and 3E, four sub bit lines SB are connected to one main bit line MB. In this case, each bank BNK needs eight bank select lines BS as compared with the four bank select lines BS in each bank BNK of FIG. 3C. Therefore, an increased number of the sub bit lines SB connected to one main bit line MB require an increased number of the bank select lines BS, resulting in a larger chip size.

On the other hand, when the consecutive banks BNK share some bank select lines BS, the number of bank select lines BS can be decreased, thereby making it possible to reduce chip size.

FIG. 3F illustrates part of a layout pattern of a semiconductor memory device in which four sub bit lines SB are connected to one main bit line MB and adjacent banks BNK share bank select lines BS. FIG. 3G illustrates an equivalent circuit of the semiconductor memory device shown in FIG. 3F. The same components as those in FIGS. 3A and 3B are indicated by the same reference numerals as those used therein. In this case, as compared with the semiconductor memory device shown in FIGS. 3D and 3E, the number of bank select lines is decreased, thereby reducing chip size.

In FIGS. 3F and 3G, however, bank cells TB (e.g., TB17 and TB27) in adjacent banks (e.g., BNK1 and BNK2) are simultaneously selected since these bank cells TB share the same bank select line BS (e.g., BS14) that is connected to the gates electrodes of the bank cells TB. Therefore, when the same word line group is connected to the adjacent banks BNK, extra two sub bit lines (e.g., SB15 and SB25) are simultaneously connected to one main bit line MB (e.g., MB1) when selecting one bank select line BS (e.g., BS14). Further, when the memory cell M selected by the word line WL is an ON-cell, an undesirable transient current flows in the main bit line MB, resulting in an access delay.

Referring to FIGS. 3F and 3G, a case where a memory cell M4 is read out will be described in greater detail. When a word line WL132 and bank select lines BS12 and BS14 are activated (raised to a high potential), a row including the memory cell M4 and bank cells TB11 and TB17 are selected and sub bit lines SB14 and SB15 are connected via the bank cells TB11 and TB17 to main bit lines MB2 and MB1, respectively. At this time, a bank cell TB27 is selected by the bank select line BS14 while a bank cell TB01 is selected by the bank select line BS12. Therefore, in a bank BNK2, a sub bit line SB25 also is connected via the bank cell TB27 to the main bit line MB1. However, when it is assumed that the adjacent banks BNK1 and BNK2 have the same word line group, a word line WL232 in the bank BNK2 also is activated. Accordingly, when it is further assumed that memory cells M21 and M22 selected by the word line WL232 are ON-cells, sub bit lines SB24 and SB26 are also connected via the memory cells M21 and M22 to the main bit line MB1, constituting a load. Furthermore, when memory cells adjacent to the memory cells M21 and M22 also are ON-cells, sub bit lines SB of the further memory cells M are connected to the main bit line MB1, constituting a load. The charging and discharging of these loads lead to an access delay.

SUMMARY OF THE INVENTION

A semiconductor memory device according to the present invention includes a semiconductor substrate; a plurality of word lines; a plurality of decoders for selectively activating the plurality of word lines in accordance with an address; and a plurality of banks arranged in a predetermined direction. Each of the plurality of banks is connected to at least one of the plurality of word lines. At least two of the plurality of word lines are connected to one common decoder of the plurality of decoders. Each of at least two of the banks is connected to the at least two word lines of the plurality of word lines. The at least two banks are not adjacent.

In one of embodiment of the invention, the at least two banks interpose at least one other bank therebetween.

In one of embodiment of the invention, each of the plurality of banks includes a plurality of sub bit lines provided across at least one of the plurality of word lines; and a memory cell array having a plurality of memory cell transistors arranged in a matrix pattern. A gate electrode of each of the plurality of memory cell transistors is connected to one of the plurality of word lines; and a channel region of each of the plurality of memory cell transistors is provided between adjacent sub bit lines of the plurality of sub bit lines.

In one of embodiment of the invention, the plurality of banks further includes a plurality of main bit lines; a plurality of bank select transistors, each of the plurality of bank select transistors selectively connecting one of the plurality of main bit lines to one of the plurality of sub bit lines; and a plurality of bank select lines. A gate electrode of each of the plurality of bank select transistors is connected to one of the plurality of bank select lines.

In one of embodiment of the invention, the plurality of banks further include a plurality of auxiliary conductive regions for connecting the plurality of bank select transistors to the plurality of main bit lines.

In one of embodiment of the invention, the semiconductor substrate is of a first conductivity type, and the plurality of sub bit lines and the plurality of auxiliary conductive regions are of a second conductivity type.

In one of embodiment of the invention, the plurality of banks are arranged on the semiconductor substrate, and adjacent banks of the plurality of banks share at least one of the plurality of auxiliary conductive regions.

In one of embodiment of the invention, at least one of the plurality of bank select transistors included in a first bank of the plurality of banks shares at least one of the plurality of bank select lines with at least one of the plurality of bank select transistors included in a second bank of the plurality of banks adjacent to the first bank.

Thus, the invention described herein makes possible the advantages of providing a semiconductor memory device having a hierarchical bit line architecture in which a bank select line is shared by adjacent bank regions while suppressing an unnecessary transient current in a main bit line.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the accompanying drawings.

Figure 1:
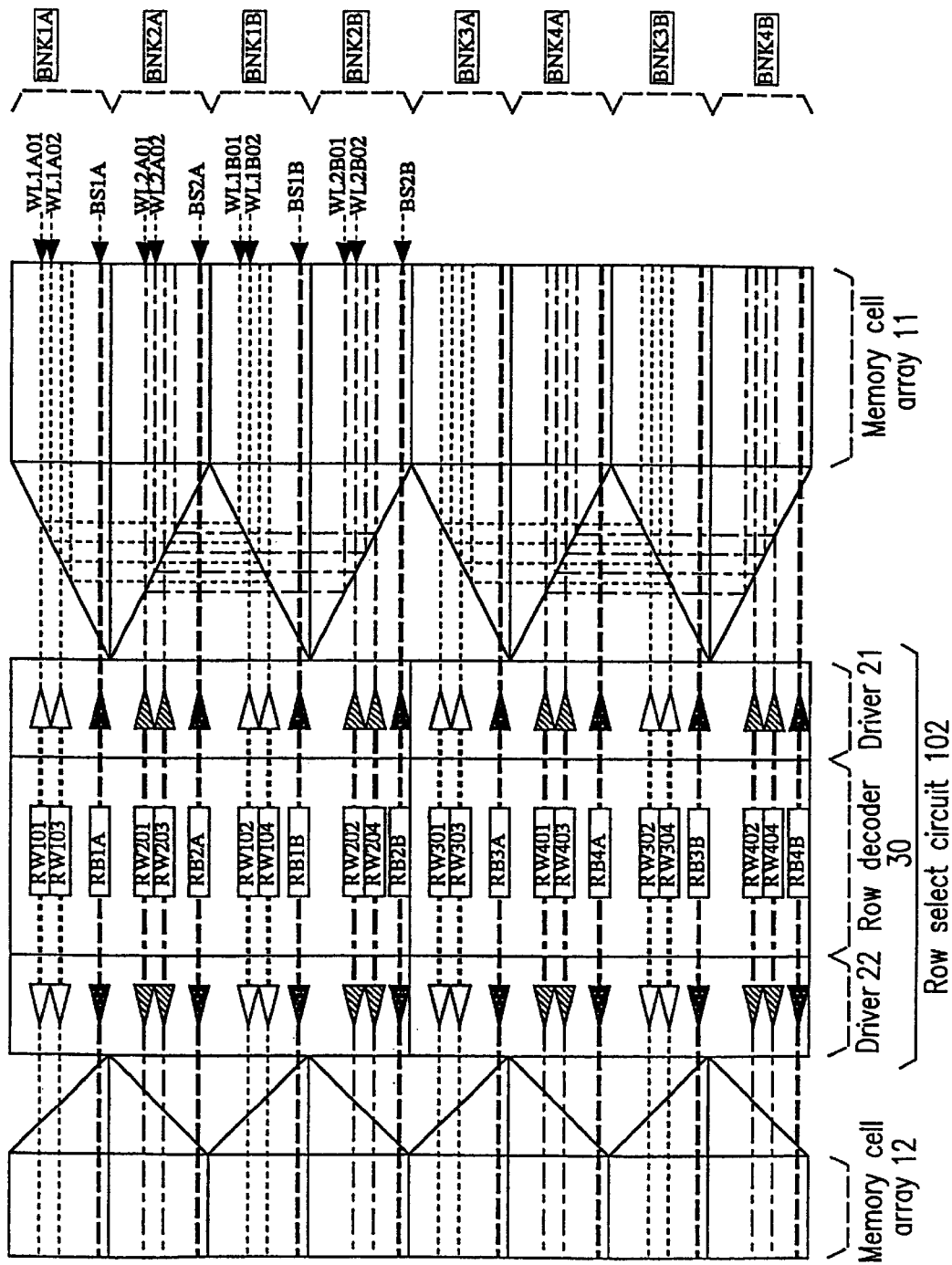
FIG. 1 is a diagram of a configuration of a semiconductor memory device according to the present invention.
Figure 3A:
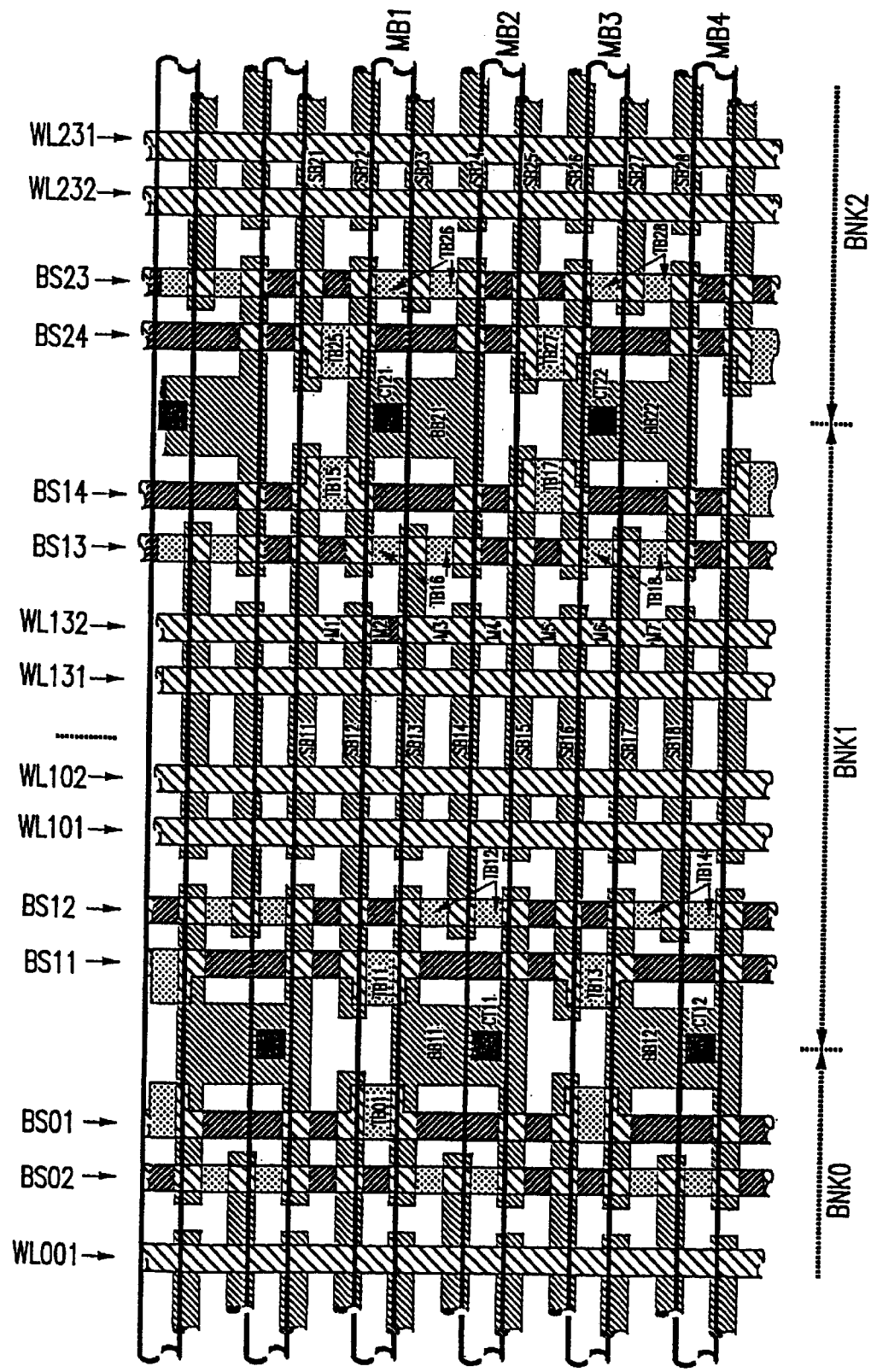
FIG. 3A is a diagram illustrating part of a layout pattern of a conventional semiconductor memory device.
Figure 3B:
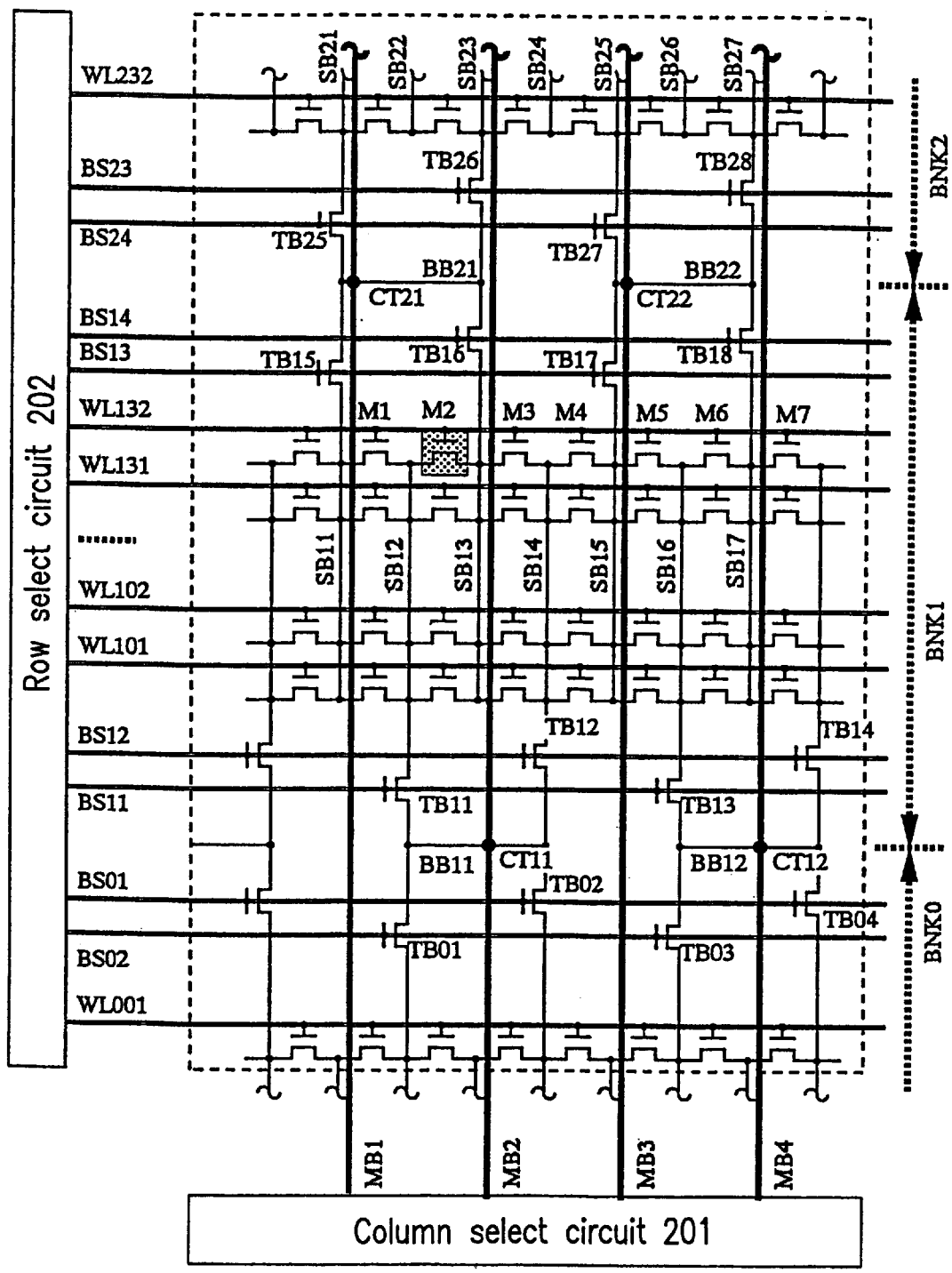
FIG. 3B is a diagram illustrating part of the equivalent circuit of the semiconductor memory device shown in FIG. 3A.
Figure 3C:
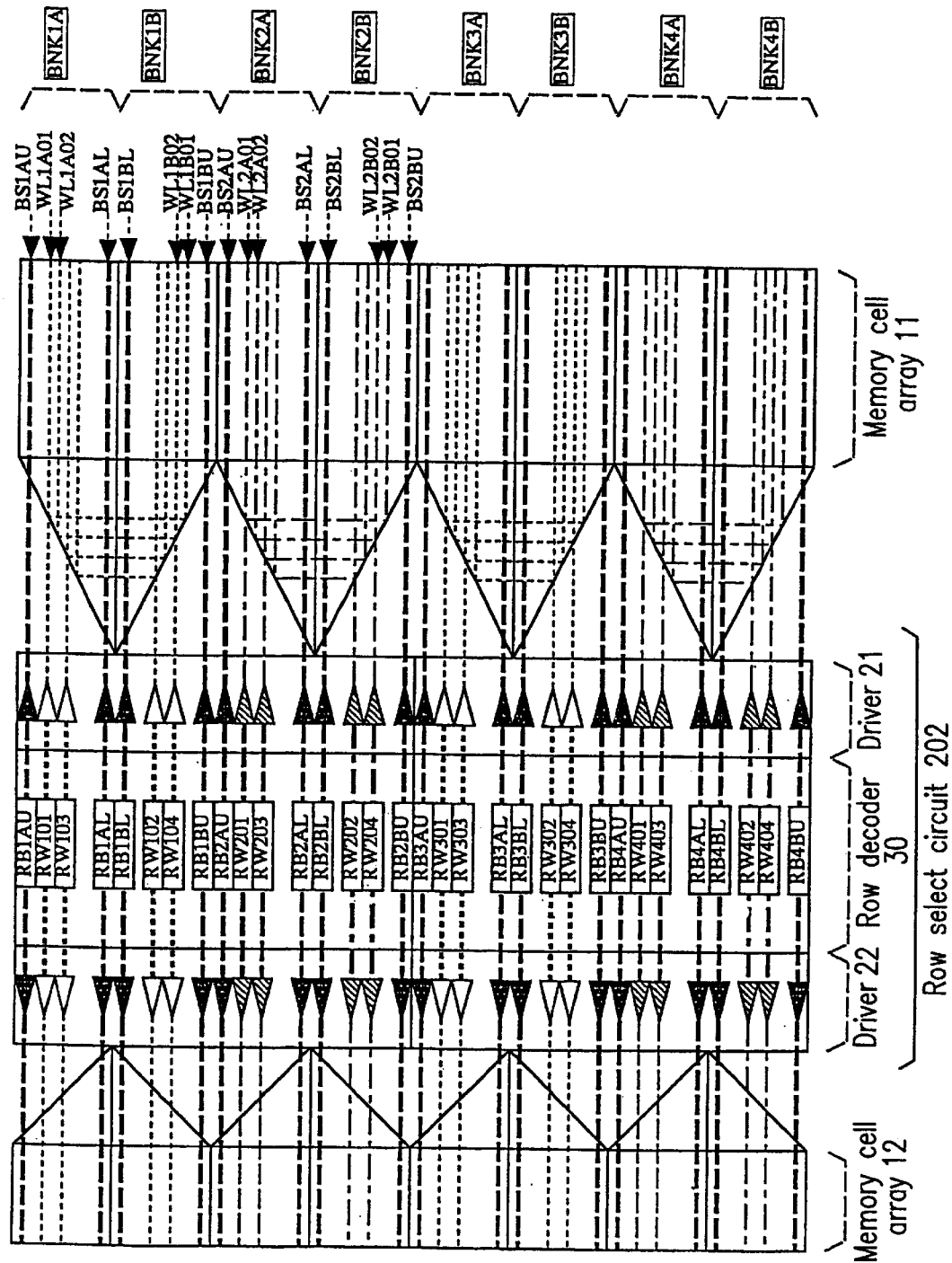
FIG. 3C is a diagram illustrating a configuration of a conventional semiconductor memory device.

FIG. 1 illustrates a configuration of a semiconductor memory device of the present invention. The same components as those in FIG. 3C are indicated by the same reference numerals as those used therein, and the descriptions thereof are omitted.

The semiconductor memory device shown in FIG. 1 includes eight banks BNK1A through BNK4B. The banks BNK1A and BNK1B are connected to one word line group. The banks BNK2A and BNK2B are connected to a subsequent word line group. Similarly, the banks BNK3A and BNK3B, and the banks BNK4A and BNK4B are connected to their respective word line groups.

Since the banks BNK1A and BNK1B are connected to the same word line group, word lines WL1A01 and WL1B01, for example, receive the same signal from the same decoder RW101. However, since the banks BNK1A and BNK2A belong to different word line groups, word lines WL1A01 and WL2A01, for example, receive different signals from decoders RW101 and RW201, respectively. Similarly, since the banks BNK2A and BNK1B belong to different word line groups, word lines WL2A01 and WL1B01, for example, receive different signals from RW201 and RW101. As described above, a bank BNK and the next non-adjacent bank BNK belong to the same word line group so that the adjacent banks BNK in the semiconductor memory device shown in FIG. 1 receive different signals from different word line groups. Therefore, a word line WL of a bank BNK will not be activated simultaneously with another word line WL of the adjacent bank BNK.

Although the adjacent banks BNK1A and BNK2A share a bank select line BS1A which selects sub bit lines of the respective banks BNK1A and BNK2A, word lines WL1A01 and WL2A01 (or WL1A02 and WL2A02) of the respective banks BNK1A and BNK2A are not simultaneously activated since the banks BNK1A and BNK2A belong to different word line groups.

In the exemplary embodiment shown in FIG. 1, each pair of banks which have another bank therebetween are connected to the same word line group. Alternatively, each pair of banks which have two other banks therebetween may be connected to the same word line group. The number of banks interposed between each pair of banks connected to the same word line group is not limited to any particular number as long as the pair of banks are not adjacent.

Figure 2A:
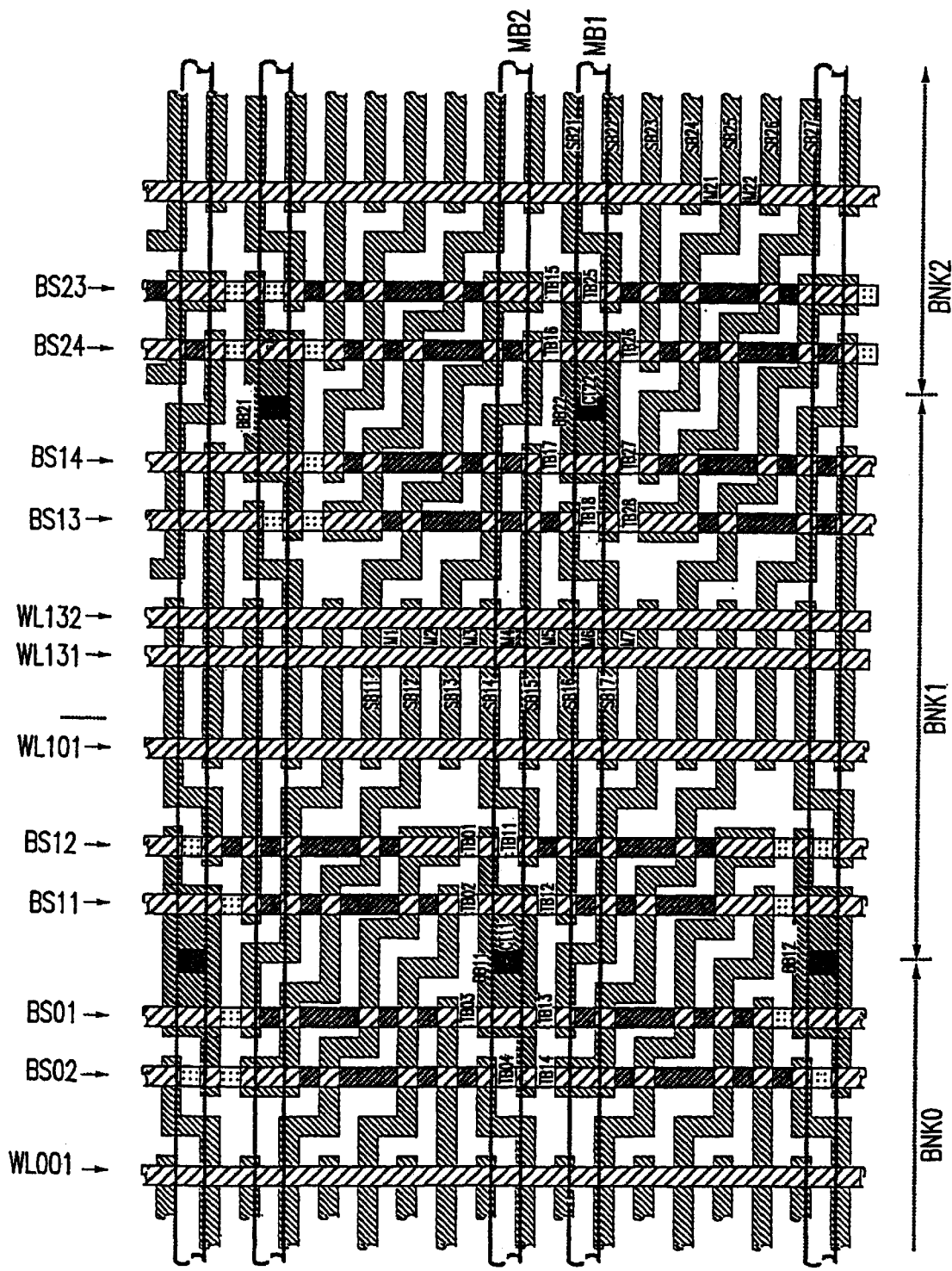
FIG. 2A is a diagram illustrating part of a layout pattern of a semiconductor memory device according to the present invention.
Figure 2B:
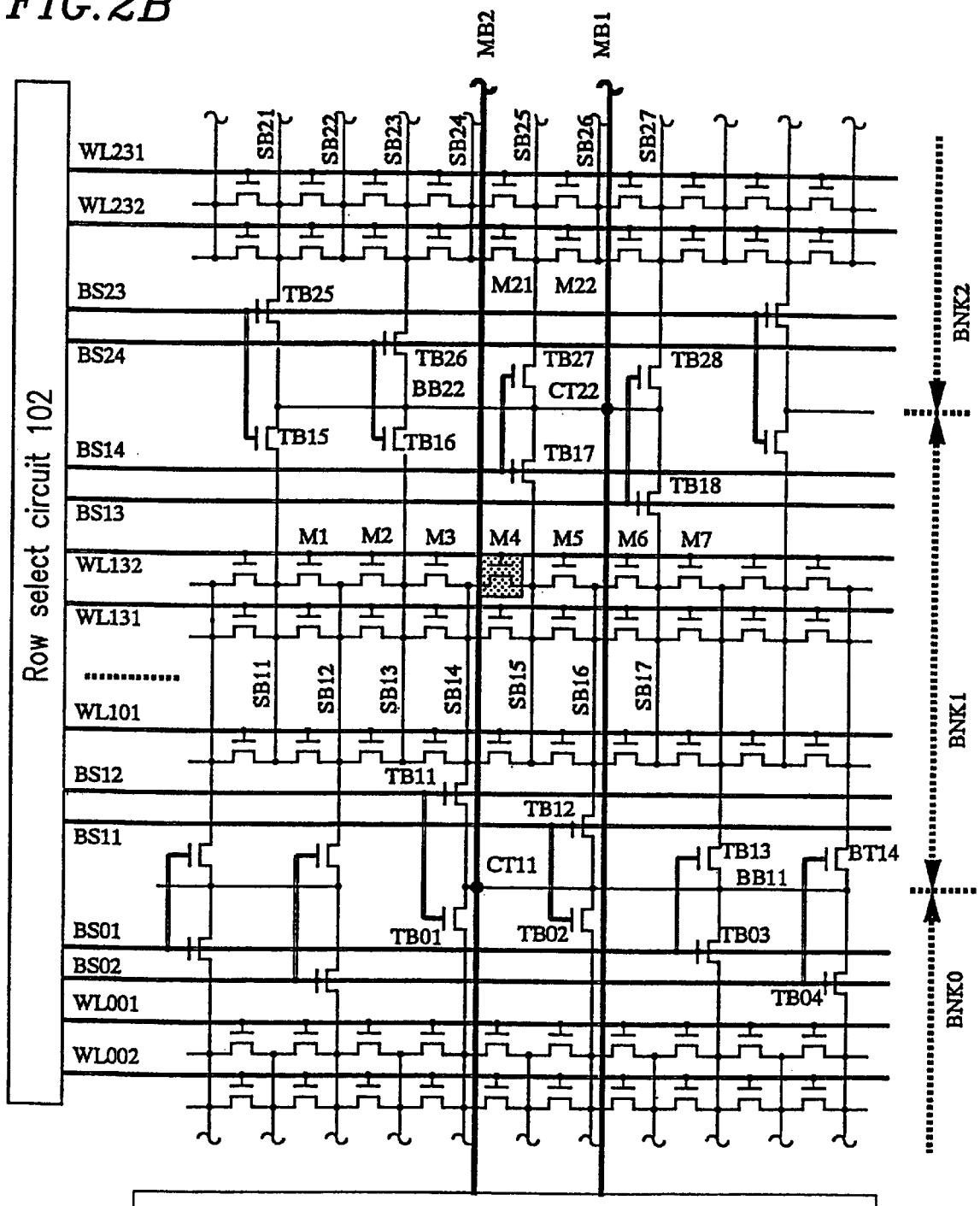
FIG. 2B is a diagram illustrating part of the equivalent circuit of the semiconductor memory device shown in FIG. 2A.

FIG. 2A illustrates part of a layout pattern of a memory cell array in a mask ROM having a hierarchical bit line architecture according to the present invention. FIG. 2B illustrates part of an equivalent circuit of the memory cell array shown in FIG. 2A. The same components as those in FIGS. 3A and 3B are indicated by the same reference numerals as those used therein.

The mask ROM shown in FIGS. 2A and 2B includes banks BNK0–BNK2, . . . For example, the bank BNK1 includes a plurality of sub bit lines SB11, . . . , SB17, . . . , a plurality of word lines WL101, . . . , WL132, . . . a plurality of memory cells M1–M7, . . . , a plurality of auxiliary conductive regions BB11, . . . , BB22, . . . , bank cells TB11, . . . , TB18, . . . , and bank select lines BS11, BS14, . . . The banks BNK0 and BNK2 have the similar configuration (FIGS. 2A and 2B).

The auxiliary conductive region BB22 is shared by the adjacent banks BNK1 and BNK2. Bank select lines BS13, BS14, BS23, and BS24 are shared by the respective set of bank cells in the banks BNK1 and BNK2. Specifically, the bank select line BS23 is shared by bank cells TB15 and TB25; the bank select line BS24 is shared by bank cells TB16 and TB26; the bank select line BS14 is shared by bank cells TB17 and TB27; and the bank select line BS13 is shared by bank cells TB18 and TB28.

The sub bit lines SB are provided on a P-negative type semiconductor substrate and formed from a diffusion layer of an N-positive type which is a conductivity type opposite to the P-negative type of the semiconductor substrate. A word line WL is provided across corresponding sub bit lines SB and is made from polysilicon. Each memory cell M is provided between a pair of sub bit lines SB. A word line WL is connected to a gate electrode of a memory cell M. An auxiliary conductive region BB is provided at an end of a corresponding sub bit line SB and has the same conductivity type as that of the sub bit line SB. A bank cell TB is provided between a corresponding auxiliary conductive region BB and a corresponding sub bit line SB. A bank select line BS is connected to a gate electrode of a corresponding bank cell TB and is made from polysilicon.

The auxiliary conductive regions BB11 and BB22 are connected via contacts CT11 and CT22 to the main bit lines MB1 and MB2, respectively. The main bit lines MB1 and MB2 are made from a metal.

The auxiliary conductive region BB22 is respectively connected via the bank cells TB15–TB18 to the sub bit lines SB11–SB17 of the bank BNK1; and is also respectively connected to the sub bit lines SB21–SB27 via the bank cells TB25–TB28 of the bank BNK2. The bank cells TB15 and TB25 share the bank select line BS23 as the common gate electrode of the bank cells TB15 and TB25. Similarly, the bank cells TB16 and TB26, bank cells TB17 and TB27, and bank cells TB18 and TB28 share the bank select lines BS24, BS14, andBS13as their common gate electrodes, respectively.

Figure 3D:
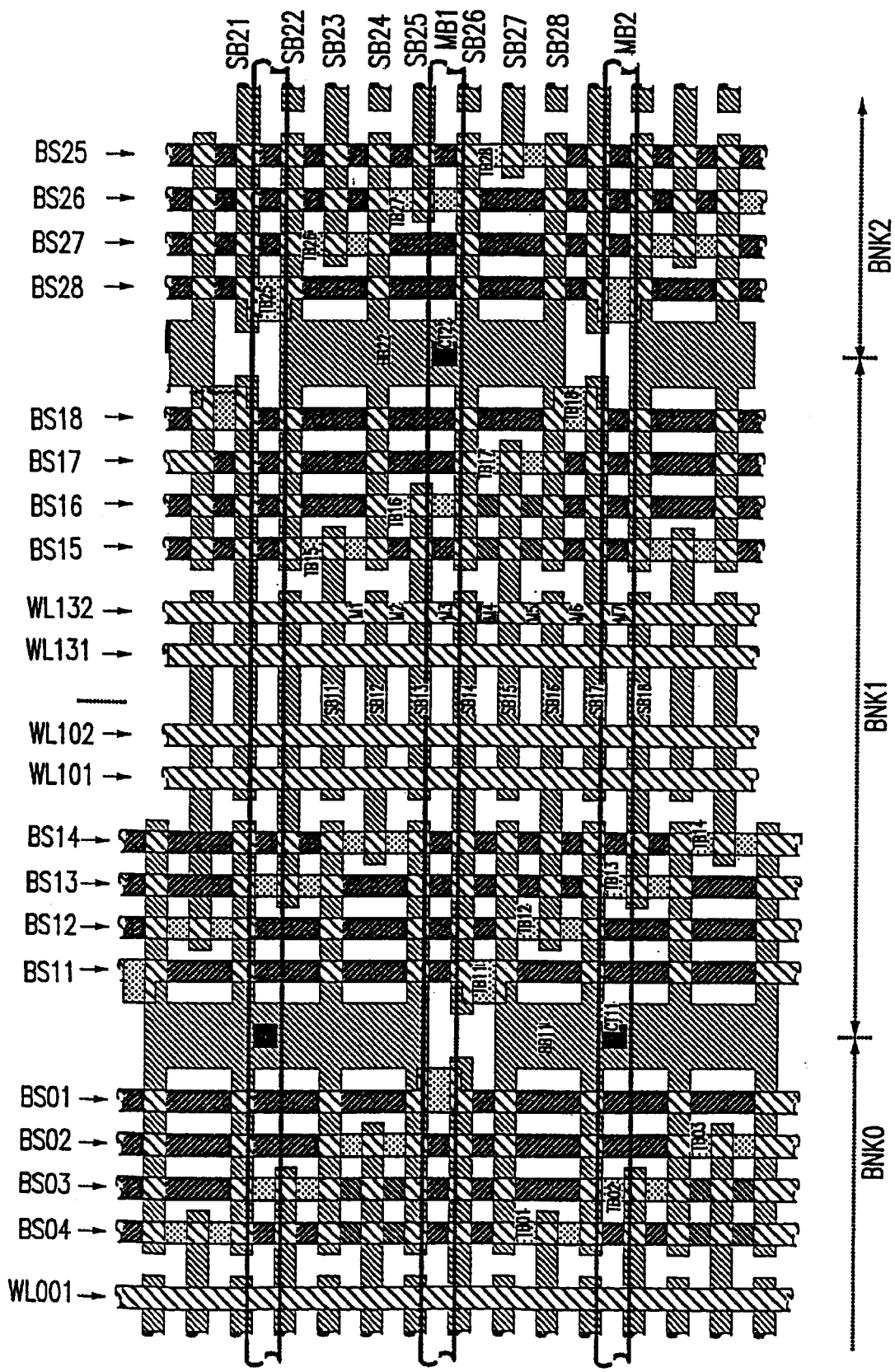
FIG. 3D is a diagram illustrating part of another layout pattern of a conventional semiconductor memory device.
Figure 3E:
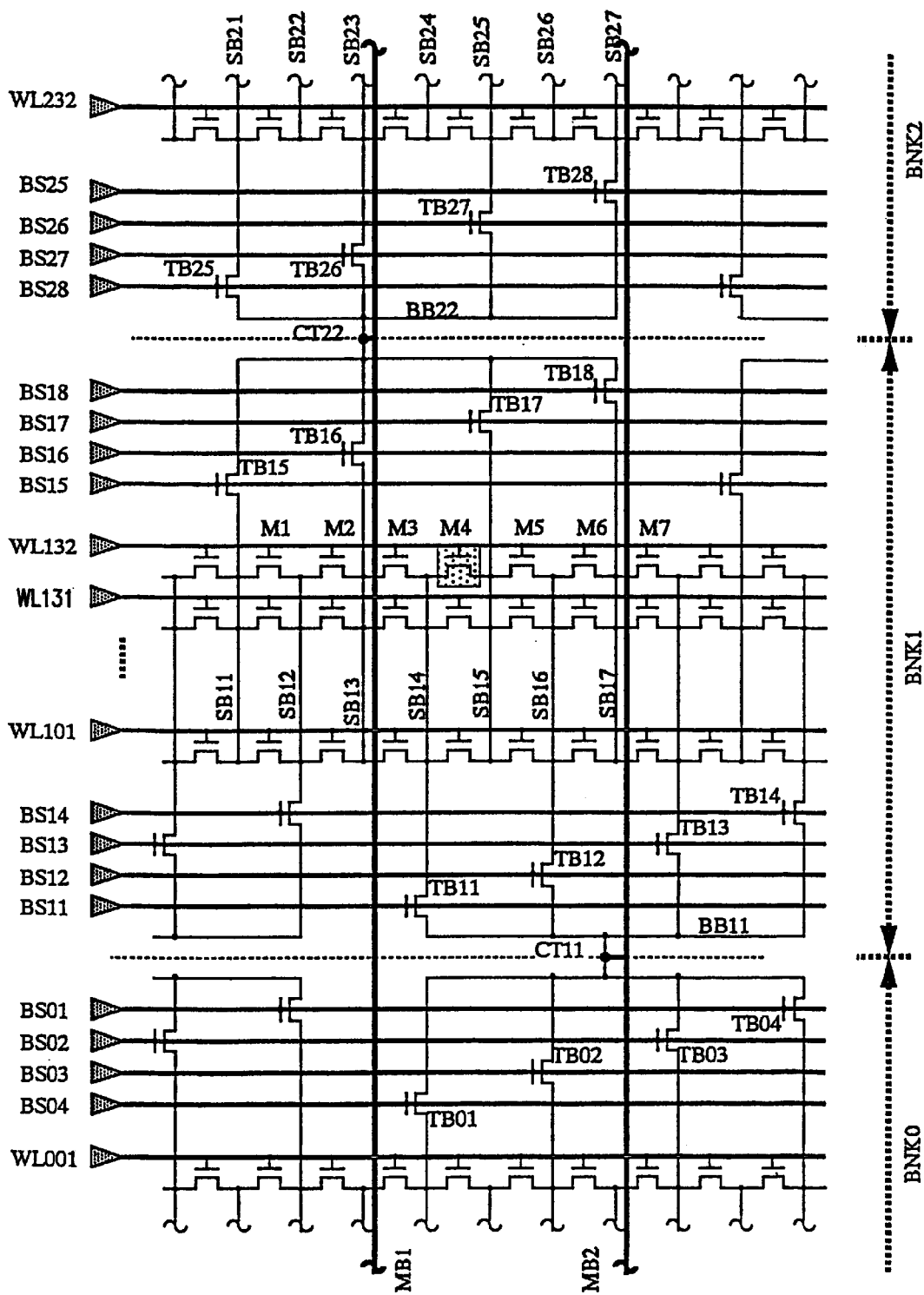
FIG. 3E is a diagram illustrating part of the equivalent circuit of the semiconductor memory device shown in FIG. 3D.
Figure 3F:
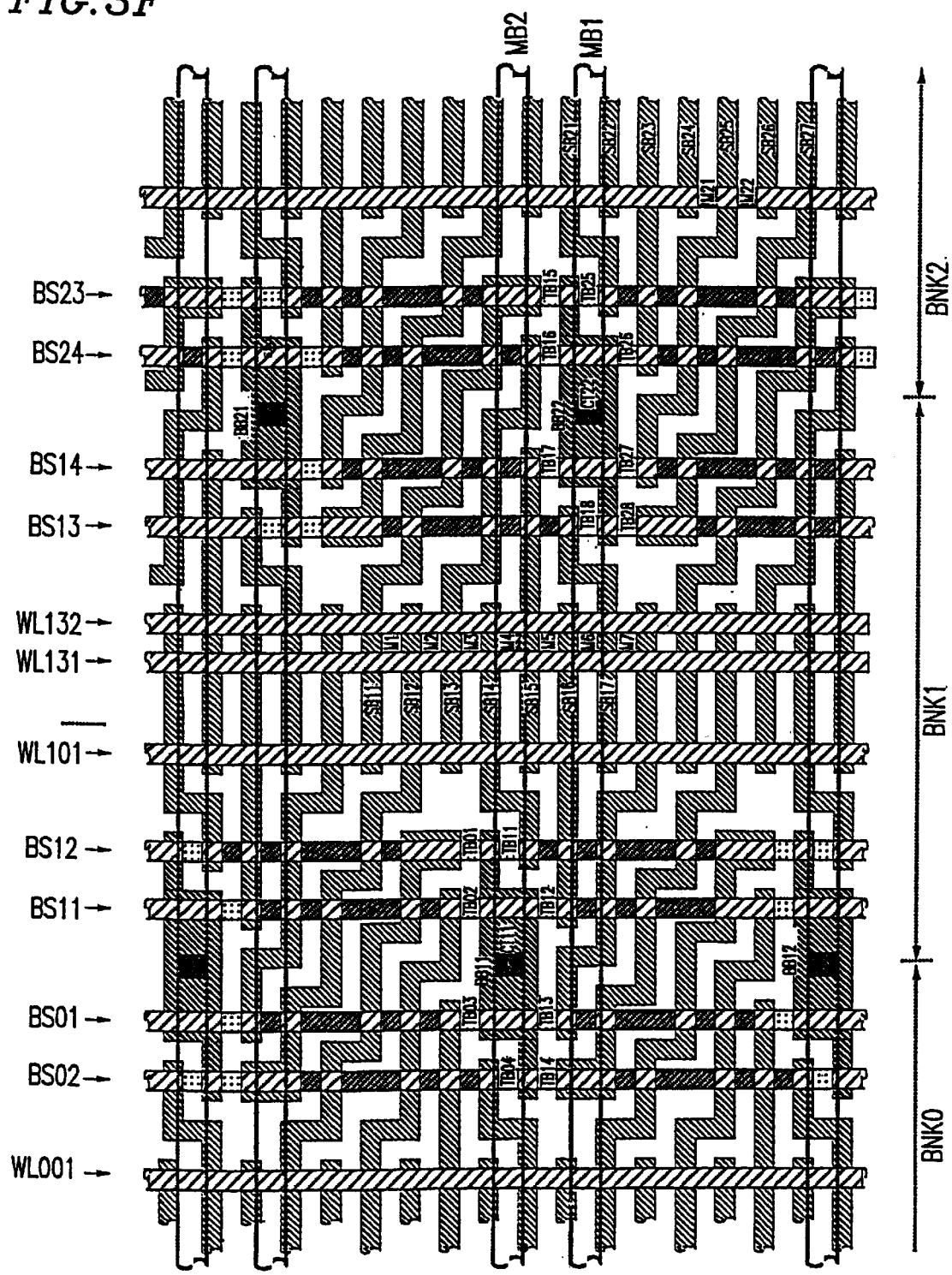
FIG. 3F is a diagram illustrating part of still another layout pattern of a conventional semiconductor memory device.
Figure 3G:
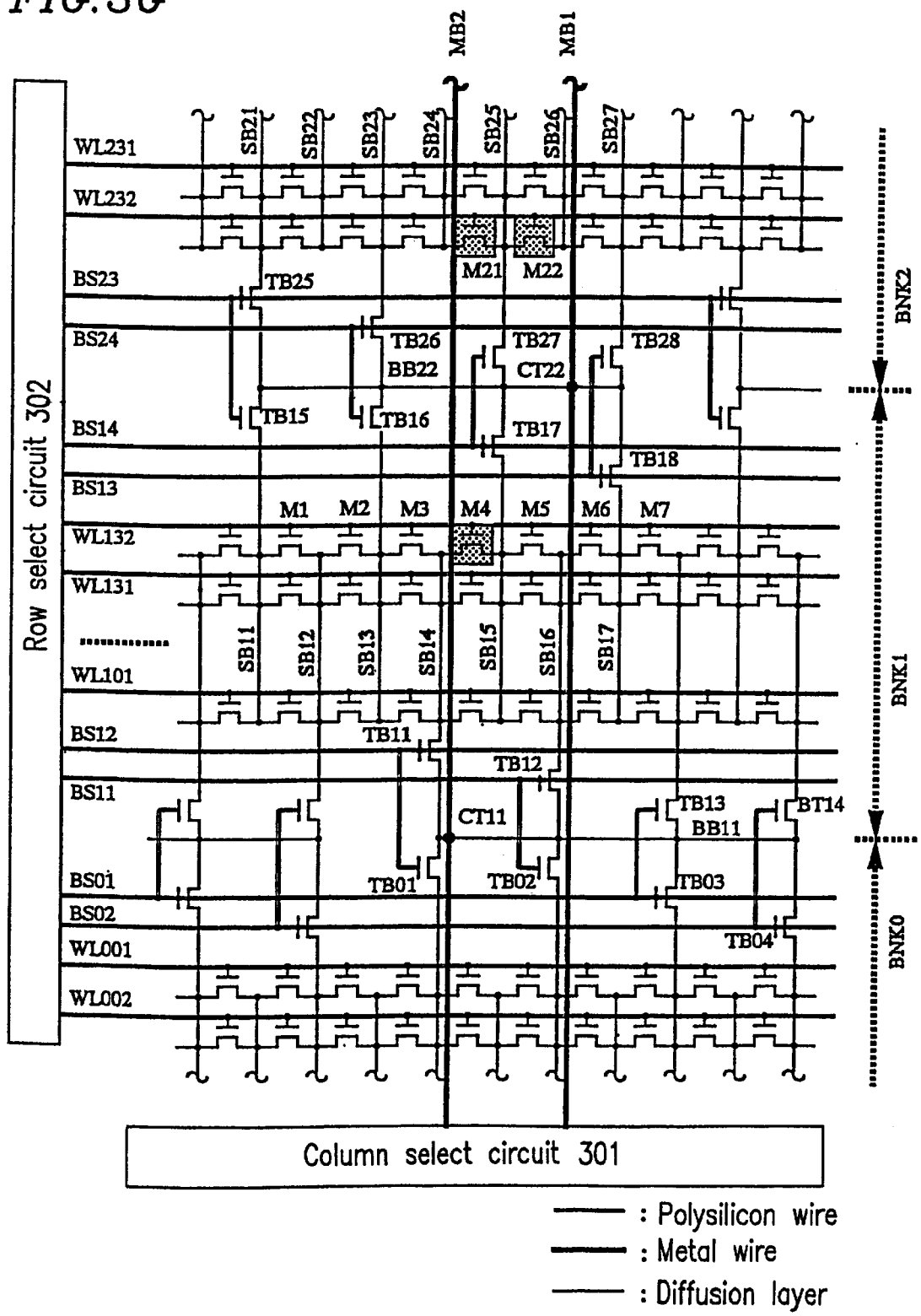
FIG. 3G is a diagram illustrating part of the equivalent circuit of the semiconductor memory device shown in FIG. 3F.

The above-described configuration leads to a reduction in the number of bank select lines as compared with that of the conventional configuration shown in FIGS. 3D and 3E.

An exemplary operation of reading out a memory cell in FIGS. 2A and 2B will be described below. Assuming that the memory cell M4 is to be read out. Firstly, the word line WL132 and the bank select lines BS12 and BS14 are activated (raised to a high potential), a row including the memory cell M4 and the bank cells TB11 and TB17 are selected and the sub bit lines SB14 and SB15 are connected via the bank cells TB11 and TB17 to the main bit lines MB2 and MB1, respectively. At this time, the bank cell TB27 is also selected by the bank select line BS14 while the bank cell TB01 is selected by the bank select line BS12. Therefore, in the bank BNK2, the sub bit line SB25 is also connected via the bank cell TB27 to the main bit line MB1. However, the banks BNK0 and BNK2 adjacent to the bank BNK1 have no activated word lines since the banks BNK0 and BNK2 belong to different word line groups than that of the bank BNK1. Therefore, the sub bit line SB25 is only connected to the main bit line MB1 without any transient current flowing therethrough, whereby there is little increase in the load of the main bit line MB1 and therefore any access delay is suppressed.

In the above-described exemplary embodiments, the mask ROM which is programmed by ion implantation is described, although the present invention can be obviously applied to other nonvolatile memories such as, for example, other types of mask ROMs or EEPROMs having a hierarchical bit line architecture. Although the word lines and bank select lines are described above as being made from polysilicon, the word lines and bank select lines may be made from polycide, silicide, or the like.

In a semiconductor memory device having a hierarchical bit line architecture according to the present invention, a bank select line is shared by adjacent banks, and it is still possible to read out an intended memory cell while suppressing an unnecessary transient current. Therefore, it is possible to reduce the number of bank select lines, and thus chip size while suppressing any access delay.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:

a semiconductor substrate;

a plurality of word lines;

a plurality of decoders for selectively activating the plurality of word lines in accordance with an address; and a plurality of banks arranged in a predetermined direction, wherein each of the plurality of banks is connected to at least one of the plurality of word lines;

at least two of the plurality of word lines are connected to one common decoder of the plurality of decoders;

at least two banks of the plurality of banks are connected to the at least two word lines of the plurality of word lines; and the at least two banks of the plurality of banks are not adjacent.

2. A semiconductor memory device according to claim 1, wherein the at least two banks interpose at least one other bank therebetween.

3. A semiconductor memory device comprising:

a semiconductor substrate;

a plurality of word lines;

a plurality of decoders for selectively activating the plurality of word lines in accordance with an address; and a plurality of banks arranged in a predetermined direction, wherein each of the plurality of banks is connected to at least one of the plurality of word lines;

at least two of the plurality of word lines are connected to one common decoder of the plurality of decoders;

at least two banks of the plurality of banks is connected to the at least two word lines of the plurality of word lines; and the at least two banks of the plurality of banks are not adjacent, wherein each of the plurality of banks includes:
- a plurality of sub bit lines provided across at least one of the plurality of word lines; and
- a memory cell array having a plurality of memory cell transistors arranged in a matrix pattern,
- wherein a gate electrode of each of the plurality of memory cell transistors is connected to one of the plurality of word lines; and
- a channel region of each of the plurality of memory cell transistors is provided between adjacent sub bit lines of the plurality of sub bit lines.

4. A semiconductor memory device according to claim 3, wherein the plurality of banks further includes:
- a plurality of main bit lines;
- a plurality of bank select transistors, each of the plurality of bank select transistors selectively connecting one of the plurality of main bit lines to one of the plurality of sub bit lines; and
- a plurality of bank select lines,
- wherein a gate electrode of each of the plurality of bank select transistors is connected to one of the plurality of bank select lines.

5. A semiconductor memory device according to claim 4, wherein the plurality of banks further include:
- a plurality of auxiliary conductive regions for connecting the plurality of bank select transistors to the plurality of main bit lines.

6. A semiconductor memory device according to claim 5, wherein the semiconductor substrate is of a first conductivity type, and the plurality of sub bit lines and the plurality of auxiliary conductive regions are of a second conductivity type.

7. A semiconductor memory device according to claim 5, wherein the plurality of banks are arranged on the semiconductor substrate, and adjacent banks of the plurality of banks share at least one of the plurality of auxiliary conductive regions.

8. A semiconductor memory device according to claim 4, wherein at least one of the plurality of bank select transistors included in a first bank of the plurality of banks shares at least one of the plurality of bank select lines with at least one of the plurality of bank select transistors included in a second bank of the plurality of banks adjacent to the first bank.

* * * * *